(12) United States Patent
Xie et al.

(10) Patent No.: US 12,476,136 B2
(45) Date of Patent: Nov. 18, 2025

(54) LINER-LESS VIA CONTACT

(71) Applicant: INTERNATIONAL BUSINESS MACHINES CORPORATION, Armonk, NY (US)

(72) Inventors: Ruilong Xie, Niskayuna, NY (US); Julien Frougier, Albany, NY (US); Nicolas Loubet, Guilderland, NY (US); Kangguo Cheng, Schenectady, NY (US); Chanro Park, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 466 days.

(21) Appl. No.: 17/643,202

(22) Filed: Dec. 8, 2021

(65) Prior Publication Data
US 2023/0178422 A1 Jun. 8, 2023

(51) Int. Cl.
*H01L 21/768* (2006.01)
*H01L 23/522* (2006.01)

(52) U.S. Cl.
CPC .... *H01L 21/76816* (2013.01); *H01L 23/5226* (2013.01); *H01L 21/76804* (2013.01); *H01L 21/76843* (2013.01)

(58) Field of Classification Search
CPC ........... H01L 21/76816; H01L 23/5226; H01L 21/76804; H01L 21/76843
See application file for complete search history.

(56) References Cited

U.S. PATENT DOCUMENTS

| | | | |
|---|---|---|---|
| 9,640,531 | B1 | 5/2017 | Or-Bach |
| 10,658,233 | B2 | 5/2020 | Motoyama |
| 10,903,111 | B2 | 1/2021 | Joseph Varghese |
| 11,081,388 | B2 | 8/2021 | Choi |
| 2016/0163645 | A1 | 6/2016 | Kamineni |
| 2017/0229344 | A1 | 8/2017 | Murray |
| 2017/0271512 | A1 | 9/2017 | Adusumilli |
| 2020/0020626 | A1 | 1/2020 | Yang |
| 2021/0193511 | A1* | 6/2021 | Wang ................. H01L 21/7685 |
| 2022/0157711 | A1* | 5/2022 | Lee .................. H01L 21/76834 |
| 2022/0271130 | A1* | 8/2022 | Su ........................ H10D 84/038 |
| 2022/0310508 | A1* | 9/2022 | Ho ...................... H01L 23/5283 |

(Continued)

FOREIGN PATENT DOCUMENTS

| | | |
|---|---|---|
| CN | 101490827 B | 6/2012 |
| KR | 1998045922 A | 9/1998 |
| KR | 100363356 B1 | 11/2002 |

OTHER PUBLICATIONS

Briggs et al., "N5 Technology Node Dual-Damascene Interconnects Enabled Using Multi Patterning", Conference Paper, May 2017, 4 pages.

(Continued)

*Primary Examiner* — Nduka E Ojeh
(74) *Attorney, Agent, or Firm* — Aaron N. Pontikos

(57) ABSTRACT

An interconnect structure and a method of forming the interconnect structure are provided. The interconnect structure includes a source drain contact above and contacting a source drain region of a semiconductor device. The interconnect structure also includes a via above and contacting the source drain contact. The via includes a lower portion with an uppermost surface that contacts a lowermost surface of an interlayer dielectric.

14 Claims, 9 Drawing Sheets

(56) References Cited

U.S. PATENT DOCUMENTS

2022/0392802 A1* 12/2022 Tien .................. H01L 21/76897
2023/0063163 A1* 3/2023 Tsai ................... H10D 30/6219

OTHER PUBLICATIONS

Ciofi et al., "RC Benefits of Advanced Metallization Options", IEEE Transactions on Electron Devices, Feb. 2019, pp. 1-7.
Lapedus, "Next Challenge: Contact Resistance", Semiconductor Engineering, Jun. 23, 2016, pp. 1-12.

* cited by examiner

LINER-LESS VIA CONTACT

BACKGROUND

This disclosure relates generally to integrated circuit fabrication and, more particularly, to interconnect devices.

Back end of line (BEOL) is the portion of integrated circuit fabrication where the individual devices (transistors, capacitors, resisters, etc.) get interconnected with wiring on the wafer, the metallization layer. BEOL generally begins when the first layer of metal is deposited on the wafer. BEOL includes contacts, insulating layers (dielectrics), metal levels, and bonding sites for chip-to-package connections. A via is an electrical connection between layers in a physical electronic circuit that goes through the plane of one or more adjacent layers. In integrated circuit design, a via is a small opening in an insulating oxide layer that allows a conductive connection between different layers.

SUMMARY

Embodiments relate to an interconnect structure and a method of forming the interconnect structure. According to one aspect, an interconnect structure is provided. The interconnect structure may include a source drain contact above and contacting a source drain region of a semiconductor device. The interconnect structure also includes a via above and contacting the source drain contact. The via includes a lower portion with an uppermost surface that contacts a lowermost surface of an interlayer dielectric.

According to another aspect, an interconnect structure is provided. The interconnect structure may include a via above and contacting a source drain contact. A top region of the source drain contact is recessed and covered with a cap, and the via has an extended contact region into the cap over the source drain contact.

According to another aspect, a method of forming an interconnect structure is provided. The method may include forming a source drain contact above and contacting a source drain region of a semiconductor device. The method may also include forming a via above and contacting the source drain contact, whereby the via includes a lower portion with an uppermost surface that contacts a lowermost surface of an interlayer dielectric.

BRIEF DESCRIPTION OF THE DRAWINGS

These and other objects, features and advantages will become apparent from the following detailed description of illustrative embodiments, which is to be read in connection with the accompanying drawings. The various features of the drawings are not to scale as the illustrations are for clarity in facilitating the understanding of one skilled in the art in conjunction with the detailed description. In the drawings:

FIGS. 1A-8B illustrate the steps of a method of forming an interconnect structure, according to at least one embodiment;

FIGS. 1A and 1B depict cross-sectional views of a semiconductor structure after an initial set of processing operations, according to at least one embodiment;

FIGS. 8A and 8B depict cross-sectional views of a process of selectively growing a metal layer, according to at least one embodiment.

The drawings are not necessarily to scale. The drawings are merely schematic representations, not intended to portray specific parameters. The drawings are intended to depict only typical embodiments. In the drawings, like numbering represents like elements.

DETAILED DESCRIPTION

Figure 1A:
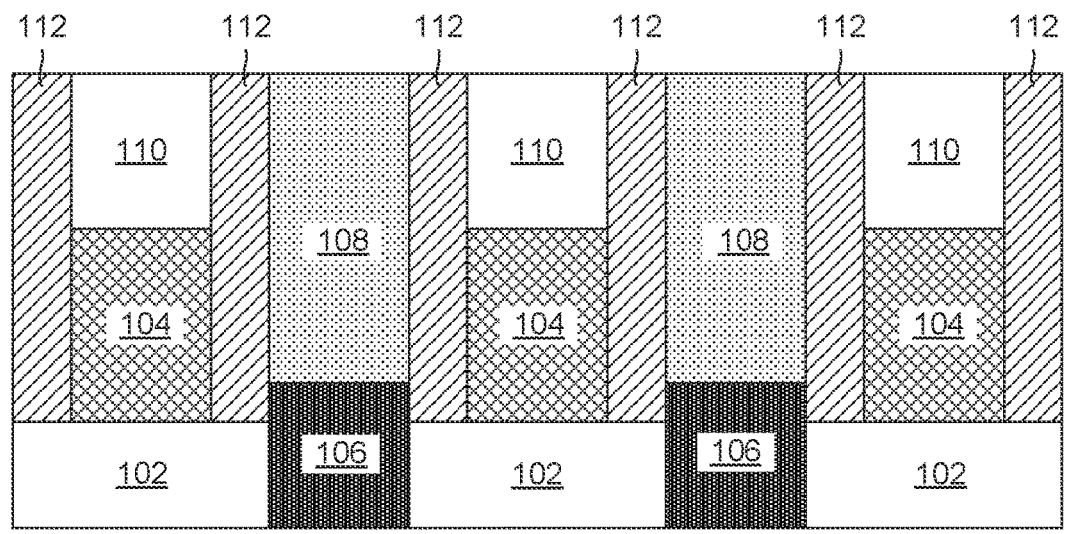

Detailed embodiments of the claimed structures and methods are disclosed herein; however, it can be understood that the disclosed embodiments are merely illustrative of the claimed structures and methods that may be embodied in various forms. Those structures and methods may, however, be embodied in many different forms and should not be construed as limited to the exemplary embodiments set forth herein. Rather, these exemplary embodiments are provided so that this disclosure will be thorough and complete and will fully convey the scope to those skilled in the art. In the description, details of well-known features and techniques may be omitted to avoid unnecessarily obscuring the presented embodiments.

It is understood in advance that although example embodiments of this disclosure are described in connection with a particular integrated circuit architecture, embodiments of this disclosure are not limited to the particular device architectures or materials described in this specification. Rather, embodiments of this disclosure are capable of being implemented in conjunction with any other type of integrated circuit architecture or materials now known or later developed.

For the sake of brevity, conventional techniques related to semiconductor device and integrated circuit fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based integrated circuits are well known and so, in the interest of brevity, many conventional steps will only be mentioned briefly herein or will be omitted entirely without providing the well-known process details.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "an example embodiment," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "right," "left," "vertical," "horizontal," "top," "bottom," and derivatives thereof shall relate to the disclosed structures and methods, as oriented in the drawing Figures. The terms "overlaying," "atop," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The terminology used herein is for the purpose of describing particular embodiments only and is not intended to be limiting of this disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of this disclosure relate generally to integrated circuit fabrication and, more particularly, to interconnect devices. Back end of line (BEOL) is the portion of integrated circuit fabrication where the individual devices (transistors, capacitors, resisters, etc.) get interconnected with wiring on the wafer, the metallization layer. BEOL generally begins when the first layer of metal is deposited on the wafer. BEOL includes contacts, insulating layers (dielectrics), metal levels, and bonding sites for chip-to-package connections. A via is an electrical connection between layers in a physical electronic circuit that goes through the plane of one or more adjacent layers. In integrated circuit design, a via is a small opening in an insulating oxide layer that allows a conductive connection between different layers.

For nanosheet transistors, as the current through the transistor increases, a via with a small contact area may become a performance bottleneck. This may be due to a landing point of the via having a higher resistance than the transistor at the junction between the via and the contact. While liner-less interconnect vias may reduce the resistance, such an approach highly relies on materials and processes. It may be advantageous, therefore, to utilize a process for fabricating liner-less vias that does not depend on material choice. This may be accomplished by increasing the contact area between the via and the transistor contacts, thereby lowering resistance. One way to fabricate an integrated circuit with liner-less vias is described in detail below by referring to the accompanying drawings FIGS. 1A-8B.

FIGS. 1A-8B depict exemplary process steps of forming an interconnect device in accordance with one or more embodiments is shown and will now be described in greater detail below. It should be noted that FIGS. 1A-8A represent a cross section view of an integrated circuit structure 100 depicting the fabrication of an interconnect device along a first axis which is perpendicular to gates of transistor, and that FIGS. 1B-8B represent a cross section view of the integrated circuit structure 100 depicting the fabrication of the interconnect device along a second axis along the source/drain regions between adjacent devices and perpendicular to the first.

Figure 1B:
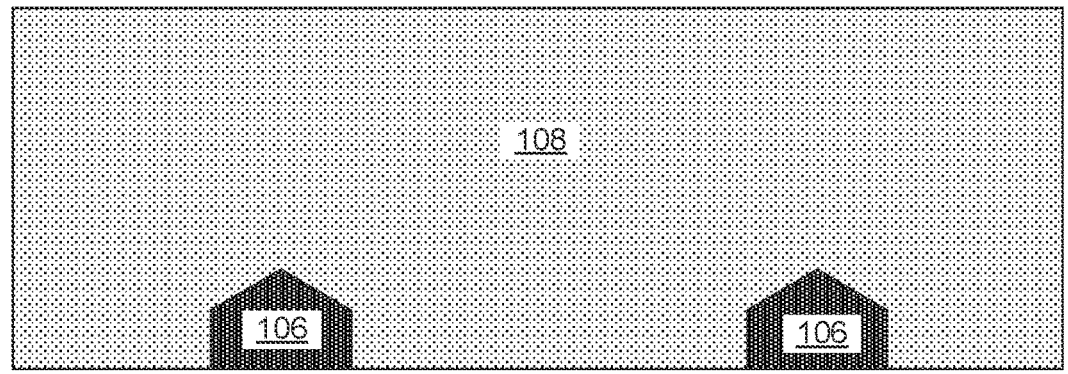

Referring now to FIGS. 1A and 1B, cross-sectional views of a semiconductor structure after an initial set of processing operations is depicted, according to one or more embodiments. FIGS. 1A and 1B depict the integrated circuit structure 100 that may include an underneath device 102, one or more gate stacks 104, one or more source drain regions 106, one or more interlayer dielectric regions 108, one or more self-aligned contact caps 110, and one or more spacers 112.

The underneath device 102 may be, among other things, a top sheet of a nanosheet transistor or a finFET having a top surface. According to one or more embodiments, the underneath device 102 may comprise either front-end-of-line devices (e.g., transistors, capacitors, resisters), middle-of-line devices, or back-end-of-line metallization layers. The particular composition of the underneath device 102 may vary based on the type of device desired.

The one or more gate stacks 104 may be in direct contact with the channel region of the underneath device 102 and may include a high-k gate dielectric separating a metal gate stack or WFM stack from the channel. The term "high-k" as used throughout the present disclosure denotes a dielectric material that has a dielectric constant greater than silicon dioxide. High-k materials include, for example hafnium silicate, zirconium silicate, hafnium dioxide and zirconium dioxide, which may be deposited using atomic layer deposition.

The one or more source drain regions 106 may be correspond to a source and a drain of the underneath device 102. The one or more interlayer dielectric regions 108 may be a non-crystalline solid material such as silicon dioxide ($SiO_2$) undoped silicate glass (USG), fluorosilicate glass (FSG), borophosphosilicate glass (BPSG), a spin-on low-k dielectric layer, a chemical vapor deposition low-k dielectric layer or any combination thereof. The term "low-k" as used throughout the present disclosure denotes a dielectric material that has a dielectric constant of less than silicon dioxide. In another embodiment, a self-planarizing material such as a spin-on glass (SoG) or a spin-on low-k dielectric material such as SiLK™ can be used as the interlayer dielectric regions 108. The self-aligned contact caps 110 may be a protective dielectric layer over the gate stacks 104 in order to prevent shorts between the gate stacks 104 and the source drain regions 106. The one or more spacers 112 may be formed between the gate stacks 104 and the source drain regions 106 and may separate the gate stacks 104 and the source drain regions 106. For ease of description, the interconnect structure and method disclosed herein may be described with respect to source drain contact vias. However, it may be appreciated that the interconnect structure and method disclosed herein may be used with top gate contact vias.

Figure 2A:
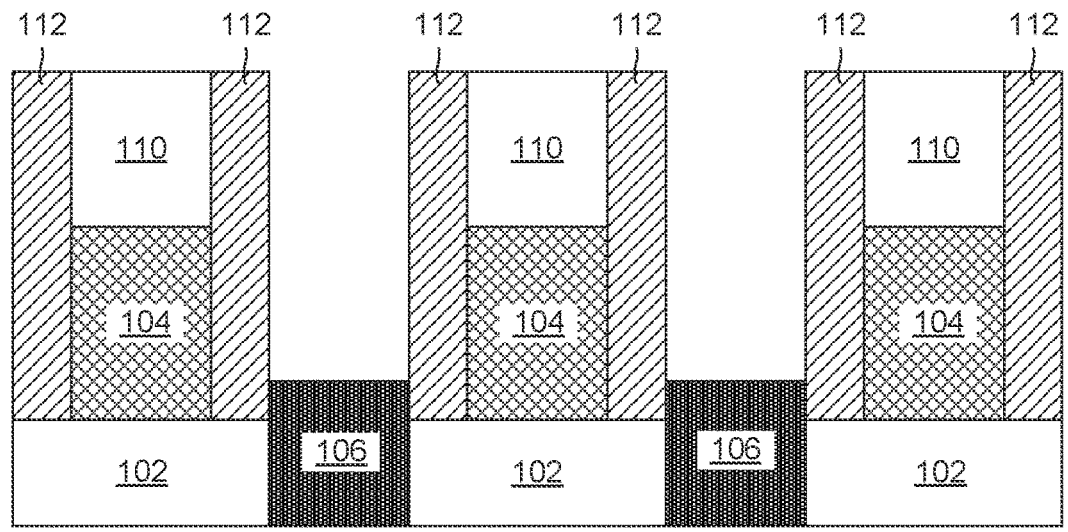
FIGS. 2A and 2B depict cross-sectional views of a process of etching interlayer dielectric regions, according to at least one embodiment.
Figure 2B:
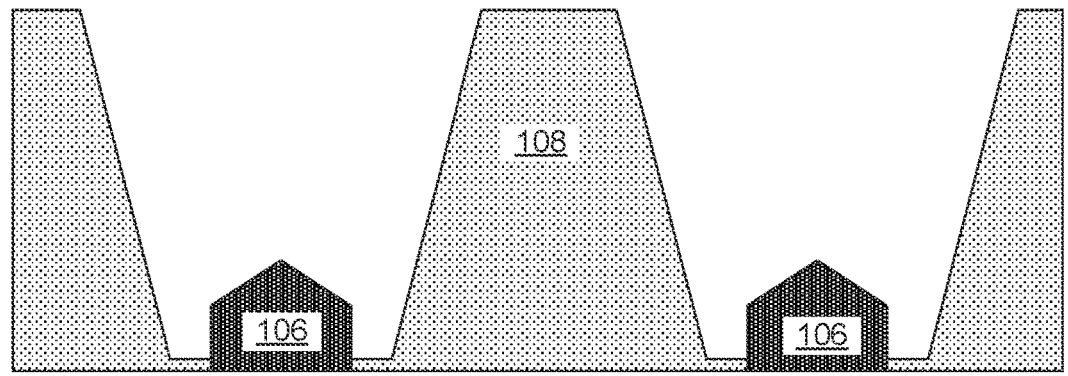

Referring now to FIGS. 2A and 2B, source/drain contact openings formed by conventional lithography and etching the interlayer dielectric regions 108 to expose the source drain regions 106 is depicted, according to one or more embodiments. An etching process, such as reactive ion etching, laser ablation, or any etch process which can be used to selectively remove a portion of material, such as the interlayer dielectric regions 108. A hardmask may be patterned using a photoresist (not shown) to expose areas of the interlayer dielectric regions 108 that do not correspond to the source drain regions 106 may be utilized during the etching process. The etching process only removes the portions of the interlayer dielectric regions 108 and may expose the source drain regions 106.

Figure 3A:
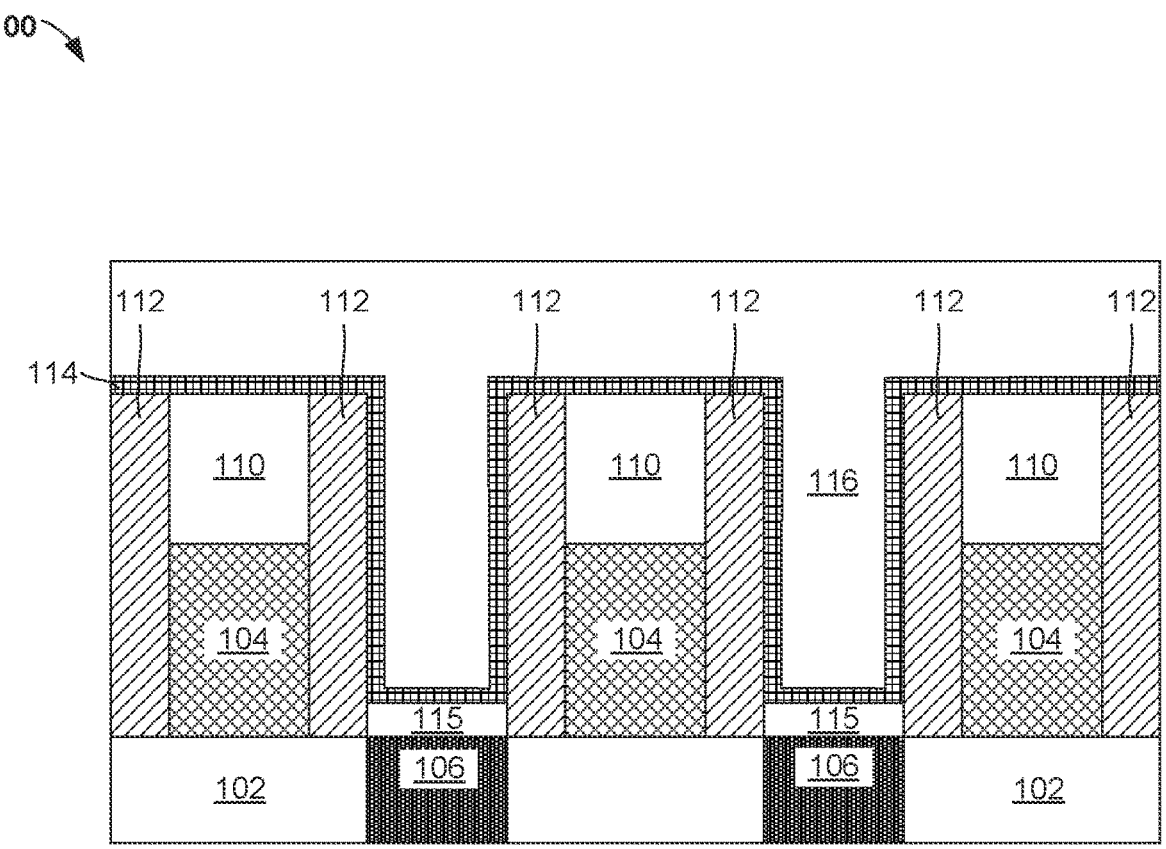
FIGS. 3A and 3B depict cross-sectional views of a process of forming a liner and source drain contacts, according to at least one embodiment.
Figure 3B:
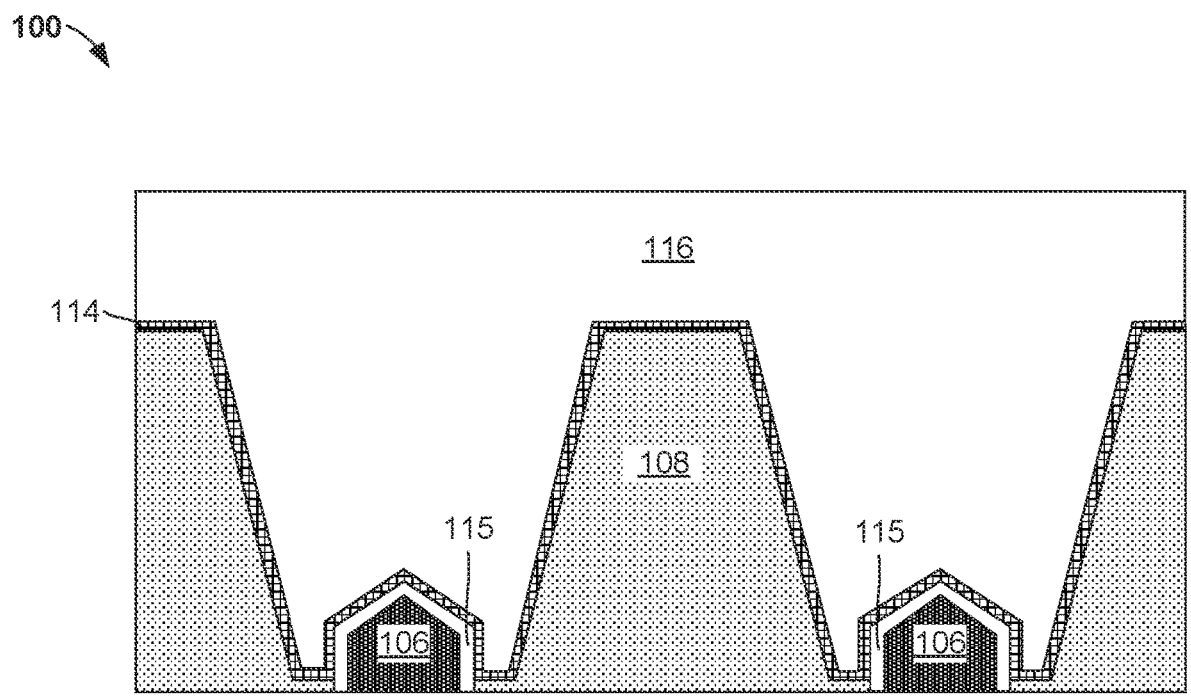

Referring now to FIGS. 3A and 3B, formation of a thin metal liner 114 and source drain contacts 116 is depicted according to one or more embodiments. Source/drain contact metallization is formed firstly by depositing a silicide liner, such as titanium, nickel, or nickel-platinum, and silicide 115 is formed over the source/drain region 106. In some embodiments, the excessive silicide liner is removed after silicide formation, and in some other embodiment, the excessive silicide liner is not removed. After that, the liner 114 is deposited on exposed surfaces. The liner 114 may be conformally deposited within openings/trenches formed previously. The liner 114 may be deposited through atomic layer deposition or another deposition process. The liner 114 may be composed of a metal, such as titanium nitride or tantalum nitride. The liner 114 may act as an adhesion metal liner for further conductive metal deposition without delamination.

The source drain contacts 116 may be deposited on the liner 114 and may be formed from any type of conductive metal. For example, the source drain contacts 116 may be composed of ruthenium, copper, cobalt, molybdenum, tungsten, aluminum, or rhodium. The source drain contacts 116 may be deposited on the liner 114 using, for example, chemical vapor deposition, plasma enhanced chemical vapor deposition, physical vapor deposition, plating, or other deposition processes. The source drain contacts 116 may be deposited above height of the interlayer dielectric regions 108. Accordingly, a planarization process, such as chemical-mechanical planarization, may be utilized to reduce the height of the source drain contacts 116 such that top surface (s) of interlayer dielectric regions 108 are exposed.

Figure 4A:
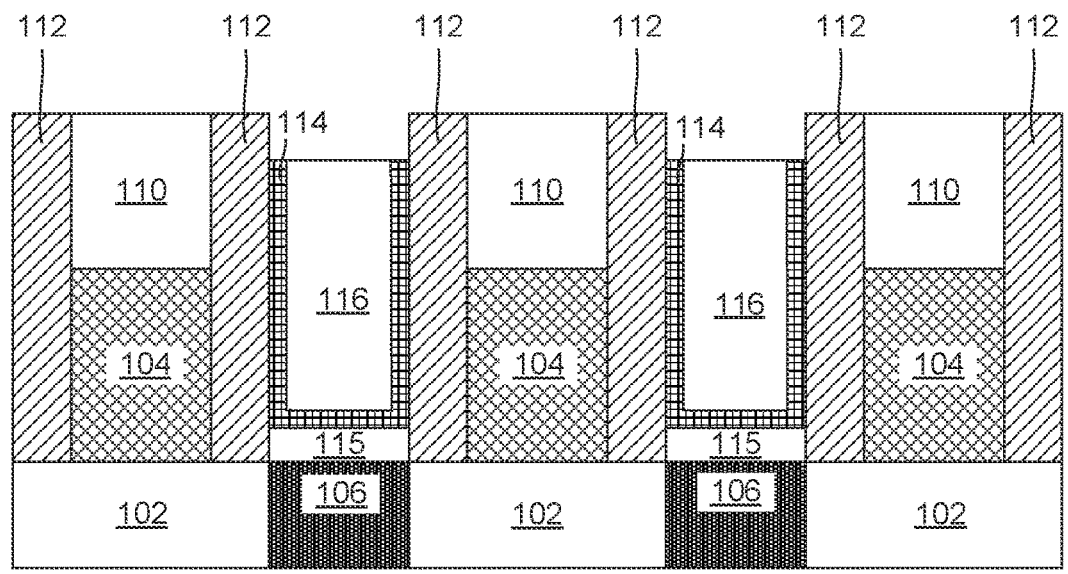
FIGS. 4A and 4B depict cross-sectional views of a process of recessing of the metal layer, according to at least one embodiment.
Figure 4B:
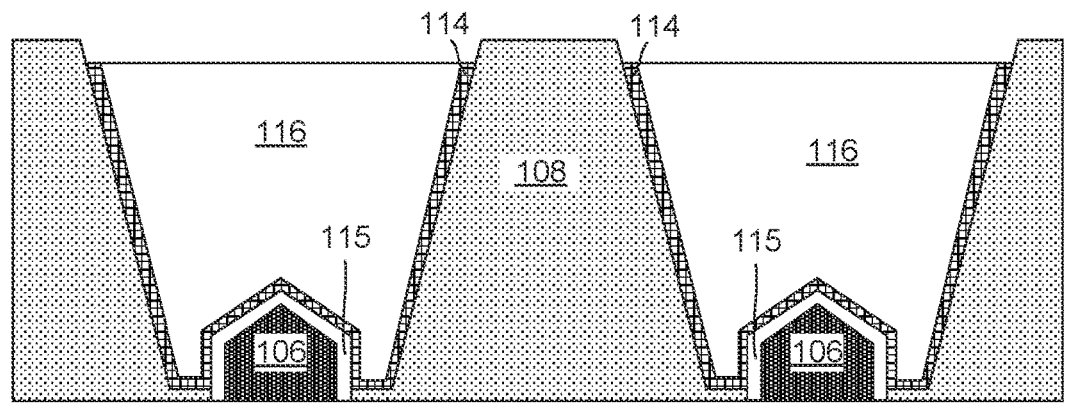

Referring now to FIGS. 4A and 4B, chemical-mechanical planarization and recessing the source drain contacts 116 is depicted, according to one or more embodiments. The source drain contacts 116 and the liner 114 may be etched such that the top surface of the source drain contacts 116 is below the top surface of the interlayer dielectric regions 108 and that the liner 114 may be removed from the sidewalls of the interlayer dielectric regions 108 above the top surface of the source drain contacts 116. The source drain contacts 116 may be etched to a depth sufficient to allow for a subsequently formed via that is thick enough to ensure a low resistance connection between the subsequently formed via and the source drain contacts 116.

Figure 5A:
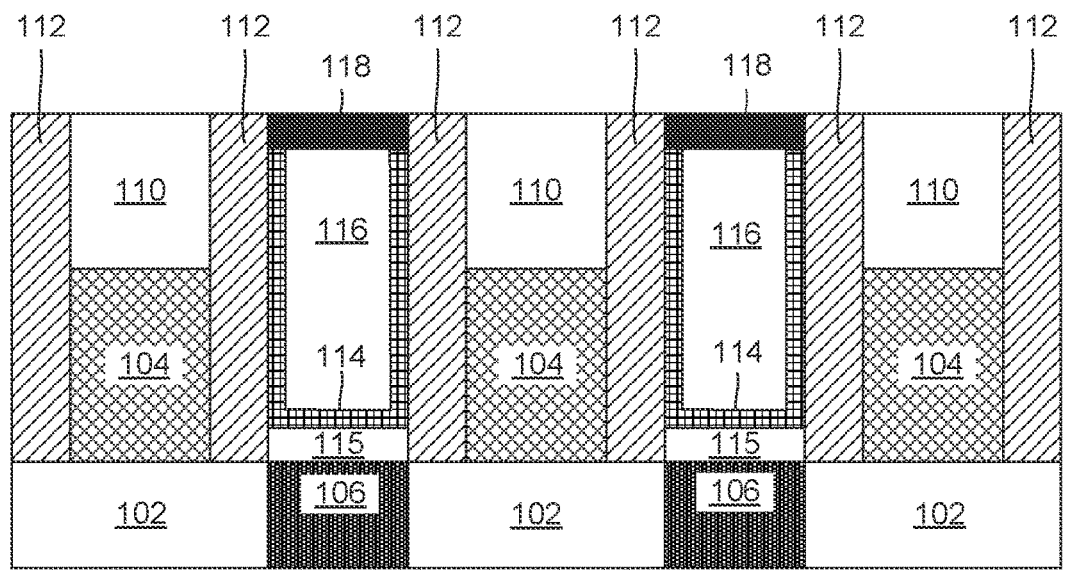
FIGS. 5A and 5B depict cross-sectional views of a process of forming one or more sacrificial caps, according to at least one embodiment.
Figure 5B:
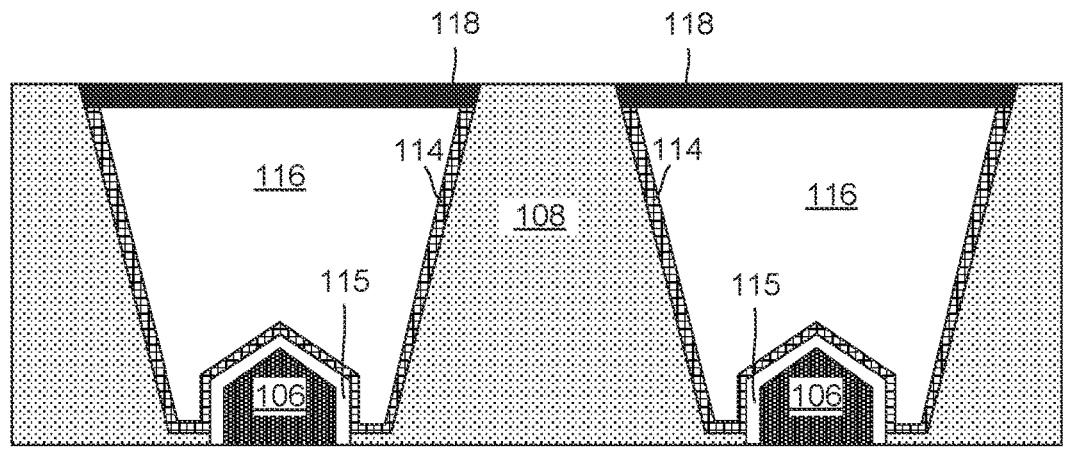

Referring now to FIGS. 5A and 5B, forming one or more caps 118 on the top surface of the source drain contacts 116 is depicted, according to one or more embodiments. The caps 118 may be in contact with the interlayer dielectric regions 108 but not in contact with sidewalls of the liner 114. Specifically, the caps 118 may be formed above and contacting at least a portion of a top surface of the source drain contacts 116. The caps 118 may be any suitable dielectric or metal layer which can be selectively etched later from a via contact, such as aluminum oxide, titanium oxide, or a high-k dielectric material, such as hafnium silicate, zirconium silicate, hafnium dioxide and zirconium dioxide. The caps 118 may be as thick as an extended contact region of a desired via.

Figure 6A:
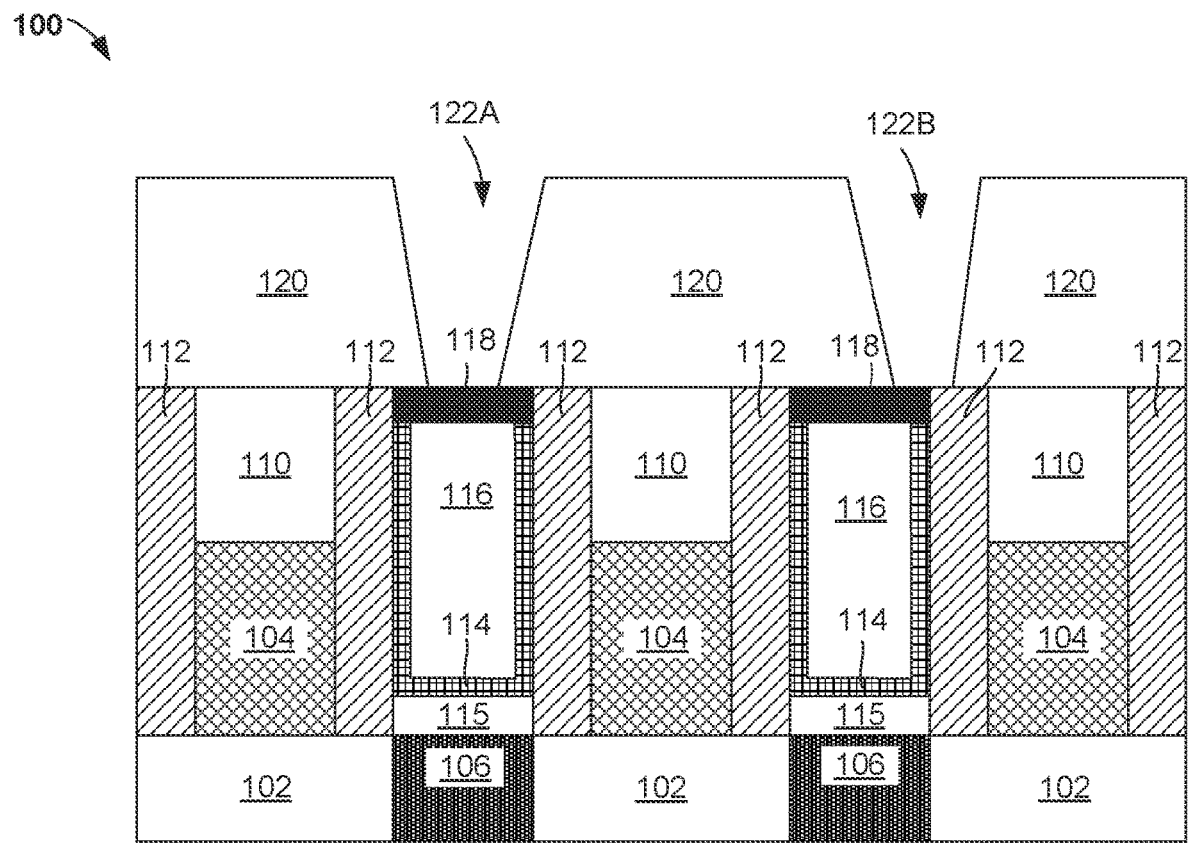
FIGS. 6A and 6B depict cross-sectional views of a process of depositing an interlayer dielectric layer, according to at least one embodiment.
Figure 6B:
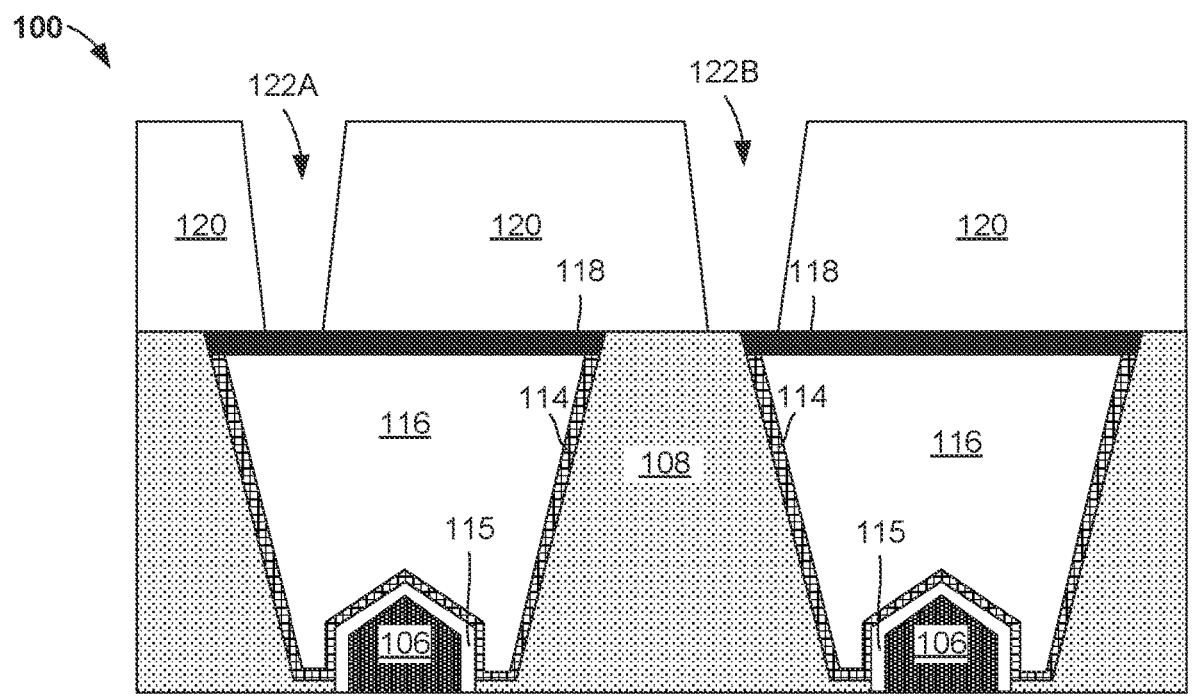

Referring now to FIGS. 6A and 6B, depositing an interlayer dielectric layer 120 over the interlayer dielectric regions 108 and the caps 118 is depicted, according to one or more embodiments. The interlayer dielectric layer 120 may be a non-crystalline solid material such as silicon dioxide ($SiO_2$) undoped silicate glass (USG), fluorosilicate glass (FSG), borophosphosilicate glass (BPSG), a spin-on low-k dielectric layer, a chemical vapor deposition low-k dielectric layer or any combination thereof. In another embodiment, a self-planarizing material such as a spin-on glass (SoG) or a spin-on low-k dielectric material can be used as the interlayer dielectric layer 120. The use of a self-planarizing dielectric material as the interlayer dielectric layer 120 may avoid the need to perform a subsequent planarizing step.

In some embodiments, the interlayer dielectric layer 120 can be formed over the interlayer dielectric regions 108 and the caps 118 utilizing a deposition process including, for example, chemical vapor deposition, plasma enhanced chemical vapor deposition, evaporation, or spin-on coating. That is, the caps 118 may be below and contacting the interlayer dielectric layer 120. In some embodiments, particularly when non-self-planarizing dielectric materials are used as the interlayer dielectric layer 120, a planarization process or an etch back process follows the deposition of the dielectric material that provides the interlayer dielectric layer 120. The interlayer dielectric layer 120 may be formed as a single layer into which openings 122A,B may be formed by a conventional lithography and etching process. By way of example and not of limitation, the openings 122A,B may correspond to a via perfectly aligned to the source drain contacts 116 and a via misaligned to the source drain contacts 116, respectively. Thus, it may be appreciated that the via structure disclosed herein may interconnect with both aligned and misaligned vias.

Figure 7A:
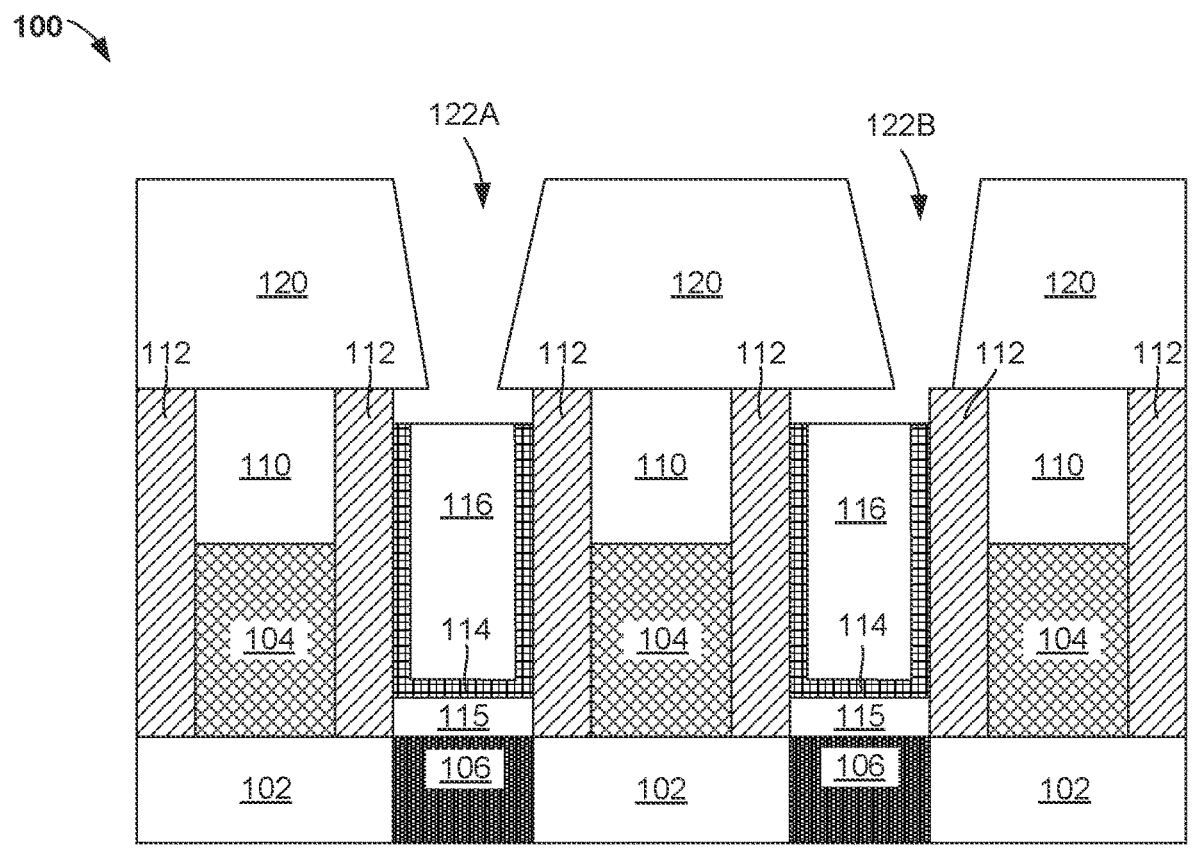
FIGS. 7A and 7B depict cross-sectional views of a process of selectively removing portions of the one or more sacrificial caps, according to at least one embodiment.
Figure 7B:
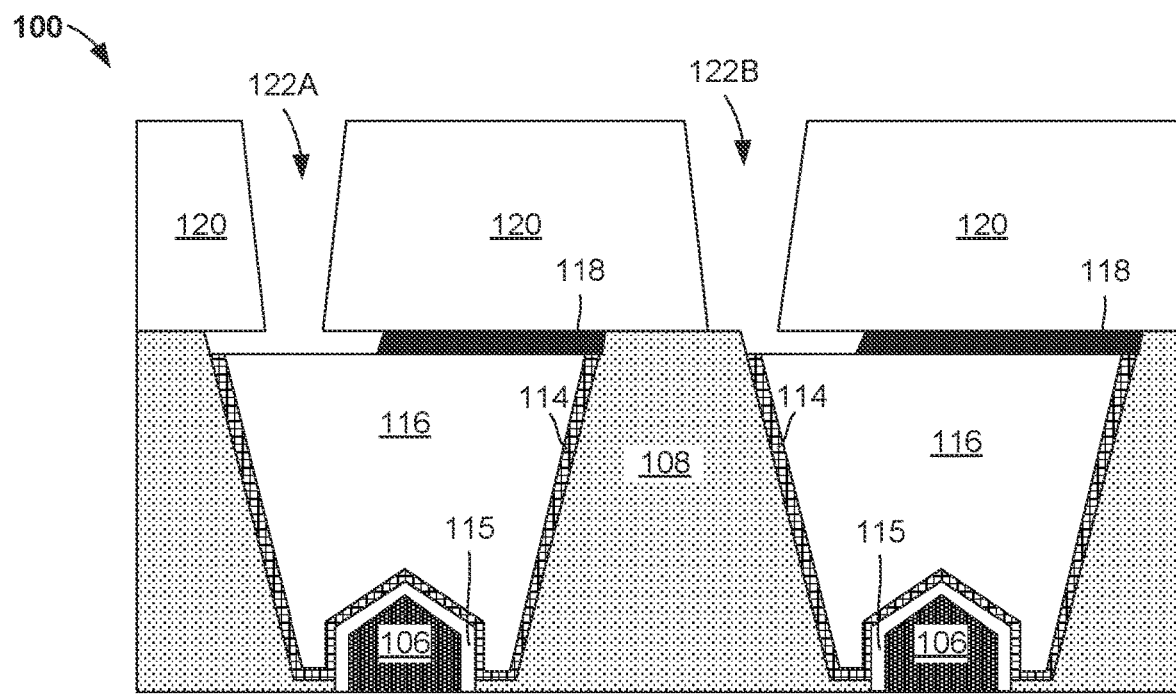

Referring now to FIGS. 7A and 7B, selectively removing portions of the one or more caps 118 where exposed by the openings 122A,B is depicted, according to one or more embodiments. The one or more caps 118 may be etched such that the interlayer dielectric layer 120 are undercut. For example, the one or more caps 118 may be etched through an isotropic wet etch process. The etchant may be chosen such that that the caps 118 are removed selective to the source drain contacts 116 and the interlayer dielectric regions 108. It may be appreciated that substantially any portion of the caps 118 may be removed so long as an appropriate etchant is selected.

Figure 8A:
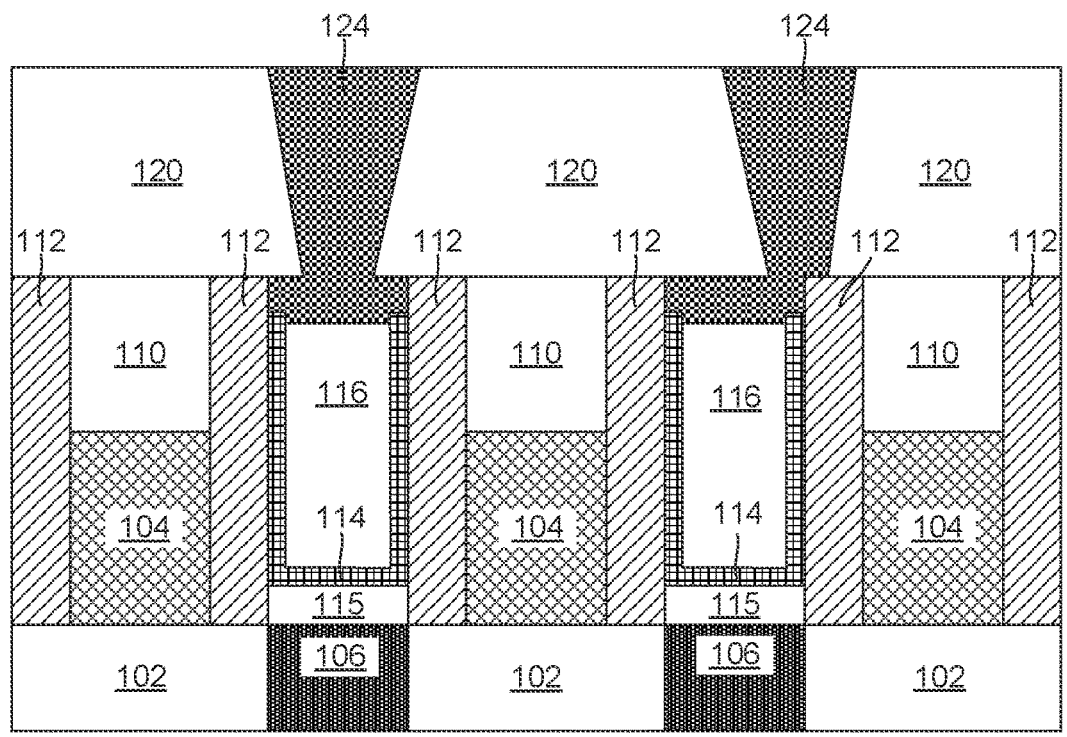
Figure 8B:
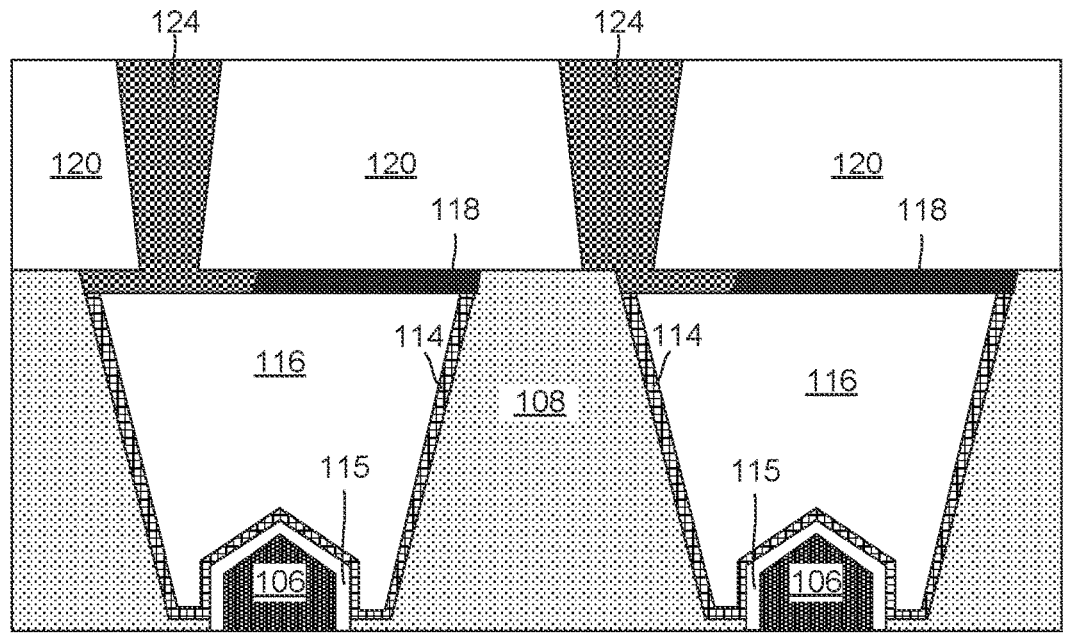

Referring now to FIGS. 8A and 8B, selectively growing a metal layer in the openings 122A,B to form one or more vias 124 is depicted, according to one or more embodiments. The vias 124 are formed from any type of conductive metal. For example, vias 124 may be composed of ruthenium, copper, cobalt, molybdenum, tungsten, aluminum, or rhodium. In some embodiments, the vias 124 are formed of the same type of metal as source drain contacts 116. The vias 124 may be formed using selective metal growth techniques. Selective metal growth techniques include bottom-up formation through selective metal growth. In some embodiments, the vias 124 are grown via selective metal growth such that an adhesion metal liner is not required. The underlying source/drain contact metals 116 and 114 act as a seeding layer of the selective metal growth. After selective metal growth, a chemical-mechanical planarization process can be optionally done to remove any non-selective metal growth over the interlayer dielectric layer 120 and planarize the vias 124 with the interlayer dielectric layer 120.

The vias 124 may include lower portions that are extended contact regions over the source drain contacts 116, under the interlayer dielectric layer 120, and in contact with sidewalls of the caps 118. The lower portions of the vias 124 may have a substantially equal thickness to the caps 118. The lower portions of the vias 124 may have an uppermost surface in direct contact with and substantially parallel to a lowermost surface of the interlayer dielectric layer 120. The extended contact regions of the vias 124 may have a larger contact area with the underlying source drain contacts that may result in a lower resistance between the vias 124 and the source drain contacts 126.

As previously described, as the current through a transistor increases, the interconnect via (e.g., vias 124) may be a performance bottleneck due to high resistance. By allowing the linerless vias 124 to extend over a larger portion of the surface of the underlying source drain contacts 116, greater contact and, therefore, lower resistance between the vias 124 and the source drain contacts 116 is achieved. The vias may be considered "liner-less" based on portions of high-resistance liners such as titanium nitride being removed and replaced with highly conductive metal fills such as tungsten, cobalt, or ruthenium. The lower resistance of the via may be achieved by fabricating the vias 124 in a shape that allows for a greater area of contact and, therefore, current flow that does not depend on material choice.

Figure 9:
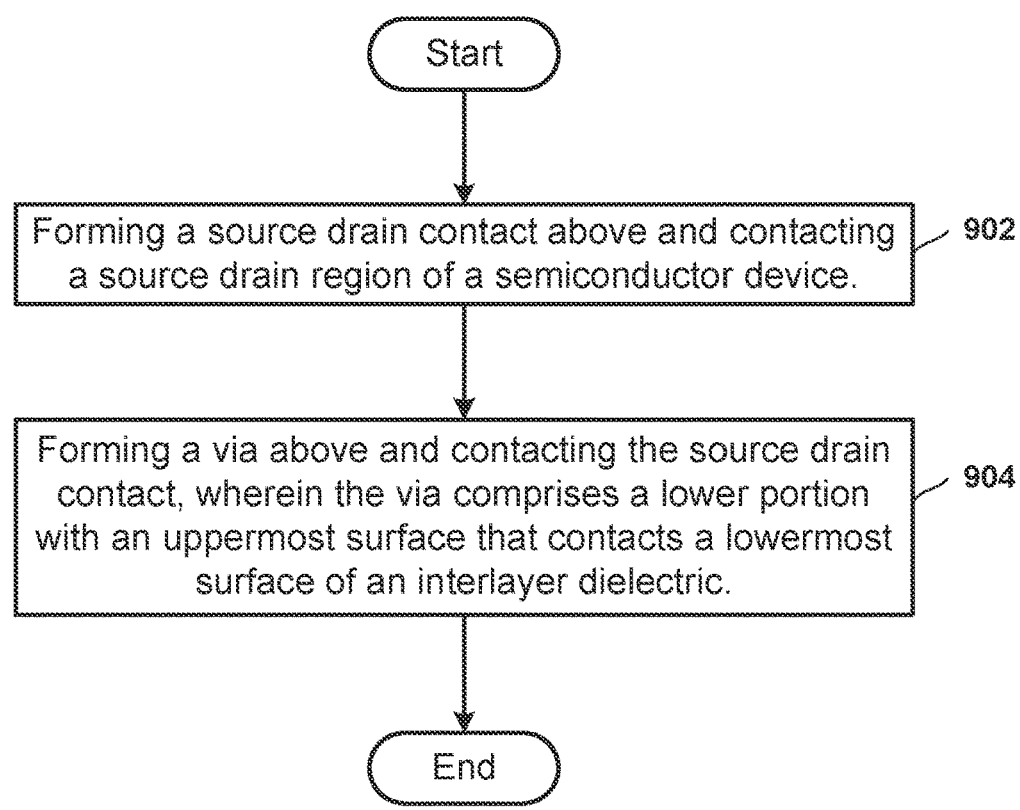
FIG. 9 depicts an operational flowchart illustrating the steps of fabricating an interconnect device, according to at least one embodiment.

Referring now to FIG. 9, an operational flowchart illustrating the steps of a method 900 for forming an interconnect structure is depicted.

At 902, the method 900 may include forming a source drain contact above and contacting a source drain region of a semiconductor device.

At 904, the method 900 may include forming a via above and contacting the source drain contact, wherein the via comprises a lower portion with an uppermost surface that contacts a lowermost surface of an interlayer dielectric.

It may be appreciated that FIG. 9 provides only an illustration of one implementation and does not imply any limitations with regard to how different embodiments may be implemented. Many modifications may be made based on design and implementation requirements.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. An interconnect structure comprising:
    a source drain contact formed from a single continuous metal layer, wherein a top region of the source drain contact is recessed and covered with a cap; and
    a via above and contacting the source drain contact, wherein the via has an extended contact region into the cap over the source drain contact.

2. The interconnect structure of claim 1, wherein a sidewall of the extended contact region directly contacts a sidewall of the cap.

3. The interconnect structure of claim 1, wherein an uppermost surface of the extended contact region of the via is in direct contact with and substantially parallel to a lower surface of an interlayer dielectric.

4. The interconnect structure of claim 3, wherein the cap is below and contacting the interlayer dielectric.

5. The interconnect structure of claim 1, wherein a thickness of the cap is equal or substantially equal to a thickness of the extended contact region.

6. The interconnect structure of claim 1, wherein the cap is composed of a material selected from the group consisting of: aluminum oxide, titanium oxide, hafnium silicate, zirconium silicate, hafnium dioxide, and zirconium dioxide.

7. The interconnect structure of claim 1, wherein the source drain contact and the via are composed of a material selected from the group consisting of: ruthenium, copper, cobalt, molybdenum, tungsten, aluminum, or rhodium.

8. A method of forming an interconnect structure, the method comprising:
    forming a source drain contact from a single continuous metal layer, wherein a top region of the source drain contact is recessed;
    covering the recessed, top region of the source drain contact with a cap; and
    forming a via above and contacting the source drain contact, wherein the via comprises an extended contact region into the cap over the source drain contact.

9. The method of claim 8, wherein a sidewall of the extended contact region directly contacts a sidewall of the cap.

10. The method of claim 8, wherein an uppermost surface of the extended contact region of the via is in direct contact with and substantially parallel to a lower surface of an interlayer dielectric.

11. The method of claim 10, wherein the cap is below and contacting the interlayer dielectric.

12. The method of claim 8, wherein a thickness of the cap is equal or substantially equal to a thickness of the extended contact region.

13. The method of claim 8, wherein the cap is composed of a material selected from the group consisting of: aluminum oxide, titanium oxide, hafnium silicate, zirconium silicate, hafnium dioxide, and zirconium dioxide.

14. The method of claim 8, wherein the source drain contact and the via are composed of a material selected from the group consisting of: ruthenium, copper, cobalt, molybdenum, tungsten, aluminum, or rhodium.

* * * * *